US009786496B2

(12) United States Patent
van Schravendijk et al.

(10) Patent No.: US 9,786,496 B2
(45) Date of Patent: Oct. 10, 2017

(54) METHOD OF DENSIFYING FILMS IN SEMICONDUCTOR DEVICE

(71) Applicant: Lam Research Corporation, Fremont, CA (US)

(72) Inventors: Bart van Schravendijk, Palo Alto, CA (US); Wei Tang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/929,007

(22) Filed: Oct. 30, 2015

(65) Prior Publication Data

US 2017/0053799 A1 Feb. 23, 2017

Related U.S. Application Data

(60) Provisional application No. 62/206,176, filed on Aug. 17, 2015.

(51) Int. Cl.
| | |
|---|---|
| *H01L 21/02* | (2006.01) |
| *H01L 21/324* | (2006.01) |
| *H01L 21/3105* | (2006.01) |
| *C23C 16/04* | (2006.01) |
| *C23C 16/56* | (2006.01) |

(52) U.S. Cl.
CPC ...... *H01L 21/02356* (2013.01); *C23C 16/045* (2013.01); *C23C 16/56* (2013.01); *H01L 21/0217* (2013.01); *H01L 21/0228* (2013.01); *H01L 21/0234* (2013.01); *H01L 21/02274* (2013.01); *H01L 21/02318* (2013.01); *H01L 21/02348* (2013.01); *H01L 21/3105* (2013.01); *H01L 21/324* (2013.01)

(58) Field of Classification Search
CPC .......... H01L 21/02356; H01L 21/0217; H01L 21/02172; H01L 21/324
See application file for complete search history.

(56) References Cited

U.S. PATENT DOCUMENTS

| | | | |
|---|---|---|---|
| 6,037,237 A * | 3/2000 | Park | H01L 21/76232 257/E21.549 |
| 7,112,513 B2 | 9/2006 | Smythe, III et al. | |
| 7,327,001 B1 | 2/2008 | Singhal et al. | |
| 2007/0155122 A1* | 7/2007 | Van Bentum | H01L 21/76237 438/424 |

(Continued)

OTHER PUBLICATIONS

U.S. Appl. No. 10/972,084, filed Oct. 22, 2004, entitled "Tensile Dielectric Films Using UV Curing."

*Primary Examiner* — Peter Bradford
(74) *Attorney, Agent, or Firm* — Weaver Austin Villeneuve & Sampson LLP

(57) ABSTRACT

Methods of densifying films, cross-linking films, and controlling the stress of films are provided herein. Methods include forming a removable film on a substrate comprising a material to be densified, and annealing the substrate to transfer stress from the removable film to the material and thereby densify the material. Some methods involve depositing a tensile capping layer on the material to be densified on a substrate and annealing the substrate at a temperature greater than about 450° C. Some methods include clamping the substrate including the material to be densified to a shaped pedestal using an electrostatic chuck to apply compressive stress to the material to be densified.

16 Claims, 7 Drawing Sheets

(56) References Cited

U.S. PATENT DOCUMENTS

| | | | |
|---|---|---|---|
| 2009/0004805 A1* | 1/2009 | Nandakumar | H01L 21/823807 438/306 |
| 2014/0023794 A1 | 1/2014 | Mahajani et al. | |
| 2014/0091395 A1* | 4/2014 | Liu | H01L 21/82380 257/368 |
| 2014/0154427 A1 | 6/2014 | Edd et al. | |
| 2015/0155242 A1* | 6/2015 | Li | H01L 23/562 257/640 |

* cited by examiner

METHOD OF DENSIFYING FILMS IN SEMICONDUCTOR DEVICE

CROSS-REFERENCE TO RELATED APPLICATION

This application claims benefit of U.S. Provisional Patent Application No. 62/206,176, filed Aug. 17, 2015, and titled "METHOD OF FILM DENSIFICATION THROUGH EXTERNAL STRESS CONTROL," which is incorporated by reference herein in its entirety and for all purposes.

BACKGROUND

Semiconductor manufacturing processes involve fabrication of dense material, such as dense dielectric material for gap fill applications. Conventional methods of forming dense material are not suitable for various applications, such as gap fill of small features. As a result, deposition into these smaller features may involve deposition of low density flowable materials. Existing densification techniques often cause oxidation or degradation of other exposed regions of a semiconductor substrate.

SUMMARY

Provided herein are methods of processing semiconductor substrates. One aspect involves forming a removable tensile film over on a substrate including a feature filled with a material to be densified on the substrate, and annealing the substrate to transfer stress from the removable film to the material and thereby densify the material.

In various embodiments, the removable film is deposited to a thickness of at least about 1000 Å.

The removable film may be tensile. The tensile stress of the removable film may be at least about 1 GPa. In some embodiments, the removable film is formed over the material to be densified. The removable film may be deposited over a feature of the substrate. The removable film may be any of silicon nitrides, metals, metal nitrides, carbon-containing dielectrics, silicon, or combinations thereof.

In some embodiments, the material to be densified is an oxide. For example, the material to be deposited may be silicon oxide deposited by atomic layer deposition. In various embodiments, the material to be densified may be a nitride or carbide.

In some embodiments, annealing the substrate induces tensile stress in the removable film. Annealing the substrate may include heating the substrate at a temperature greater than at least about 450° C. In various embodiments, annealing the substrate includes crosslinking a seam in the feature.

In some embodiments, the method also includes treating the substrate with ultraviolet radiation or plasma after annealing the substrate. For example, UV radiation around 30-150 nm may be used for crosslinking. In some embodiments, a plasma may include any of He, Ar, H, O, N and mixtures and compounds thereof. The method may also include removing the removable film.

In some embodiments, the removable film is compressive. The removable film formed on the substrate may be deposited on the backside of the substrate. In some embodiments, the compressive film is any of nitride films, carbon-containing films, carbonitride films, metals, metal nitrides, carbon, or $Si_xB_yN_zC_pH_q$ compounds. The removable film may be deposited on the substrate housed in a furnace.

Annealing the substrate may induce compressive stress in the removable film. The method may also include forming a removable tensile film over the material to be densified prior to annealing the substrate.

In some embodiments, the material to be densified is cured by UV without depositing a capping layer. For example, the material to be densified may be cured by UV at a temperature less than about 1000° C., or less than about 600° C. In some embodiments where the material to be deposited is silicon oxide, the method may also include exposing the substrate to a hydrogen-containing and/or an oxygen-containing compound, such as $H_2O$ or $H_2O_2$.

Another aspect involves a method including providing a substrate having a feature filled with a material, and clamping the substrate to a shaped pedestal to apply stress to the material. In some embodiments the shaped pedestal is bowl-shaped.

Another aspect involves an apparatus for processing semiconductor substrates, the apparatus including: a. at least one process chamber including a heated pedestal for holding a substrate; b. at least one outlet for coupling to a vacuum; c. one or more process gas inlets coupled to one or more sources; d. a controller for controlling operations in the apparatus, including machine readable instructions for performing any of the methods above.

These and other aspects are described further below with reference to the drawings.

DETAILED DESCRIPTION

Figure 1:
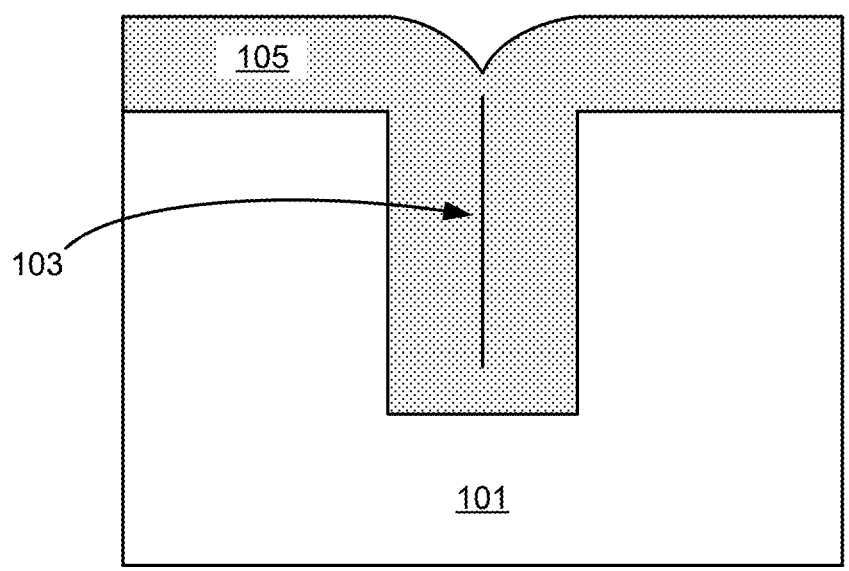
FIG. 1 is a schematic drawing of a substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor manufacturing processes involve fabrication of dense material, such as dense dielectric material for gap fill applications. Examples include formation of dense dielectric material in shallow trench isolation (STI) or formation of pre-metal dielectrics (PMD). However, as devices shrink, features in which such material is deposited become increasingly small and deposition of dense material becomes challenging.

Flowable methods have been developed to effectively fill such small features in substrates. These methods include spin on deposition processes as well as depositing flowable materials from vapor phase reactants by chemical vapor deposition (CVD). Flowable materials are self-planarizing and can provide bottom-up rather than conformal fill of a feature. However, flowable materials are deposited with low density. As a result, these materials are densified by shrinkage. However, in a high aspect ratio feature, the film is confined on three sides by the sidewalls and bottom of the feature, and thus cannot shrink sufficiently to be fully densified. Low density material in the trench may be exposed in later process steps, which leads to undesirable rapid and uncontrolled removal of the material in cleaning and etching operations.

Some methods of gap fill with silicon oxide materials involve depositing a silicon layer in the gap and oxidizing it. However, these methods may cause oxidation of other exposed materials, and the compression amount is not equal for each trench width, resulting in varying properties of deposited material over a substrate. For example, wider trenches would yield less compression, while narrower trenches would yield greater compression.

Another method involves oxide deposition by atomic layer deposition (ALD). ALD processes use surface-mediated deposition reactions to deposit films on a layer-by-layer basis. In one example of an ALD process, a substrate surface, including a population of surface active sites, is exposed to a gas phase distribution of a first reactant or precursor, such as a silicon-containing gas, in a dose provided to a process station housing the substrate. Molecules of this first precursor are adsorbed onto the substrate surface, including chemisorbed species and/or physisorbed molecules of the first precursor. After a first precursor dose, the reactor is then evacuated to remove any first precursor remaining in gas phase so that only the adsorbed species remain. A second reactant, such as an oxygen-containing gas, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

Oxides deposited by ALD typically have higher density than oxides deposited by flowable deposition processes. However, oxides deposited by ALD are conformal, and a lower density seam forms where oxide growth from the two sidewalls come together. FIG. 1 shows an example of a substrate 101 including a feature, whereby ALD oxide 105 is deposited conformally in the feature. A seam 103 forms in the middle of the filled feature where the oxide growth from the two sidewalls of the feature meet and the seam 103 may later open up during additional processing. Conductive materials may be inadvertently deposited into the seam, thereby causing electrical shorts.

Methods of forming densified films are described herein. Methods involve controlling stress from external sources to control the stress of a material to be densified. For example, some methods involve depositing a tensile film or capping layer over a material to be densified, or otherwise causing compressive stress of the material to be densified to increase density and/or cross-linking in the material. Methods may also be suitable for repairing seams in the material. A capping layer deposited over a material to be densified may be tensile as deposited, or may be made tensile by annealing the capping layer after the capping layer is deposited. Films that are low density can become very tensile upon annealing. For example, films with low density may include incorporated hydrogen atoms, such that when the film is annealed, hydrogen leaves and the film contracts. Methods also involve treating the material to be densified by ultraviolet radiation or plasma.

In various embodiments, a capping layer that is tensile as deposited may be deposited only on the front side of a substrate (over the material to be densified). In some embodiments, where a capping layer that is tensile as deposited is deposited on both the backside and the front side of a substrate, the tensile capping layer on the backside may be largely removed. Note that although the term "capping layer" is used to describe a layer that may be deposited on the backside, a capping layer that is deposited on the backside is not deposited over the film to be densified. In some embodiments, a tensile film may be present on the front side, while a compressive film is on the backside of the substrate. In some embodiments, a compressive film may be present on the front side, while a tensile film is on the backside of the substrate. In some embodiments, both the front side and backside include compressive films. In some embodiments, both the front side and backside include tensile films. Backside-only deposition is also possible using some backside-only deposition tools.

Methods are suitable for densifying a wide variety of films regardless of the feature size, including oxides, nitrides, and carbides. For example, disclosed embodiments may be suitable for repairing a seam in an ALD-deposited oxide, or may also be suitable for densifying flowable oxides. Disclosed embodiments are suitable for densifying planar-deposited films and controlling stress of deposited films. In particular, disclosed embodiments may be suitable for fabrication of VNAND structures by controlling substrate bowing.

Figure 2A:
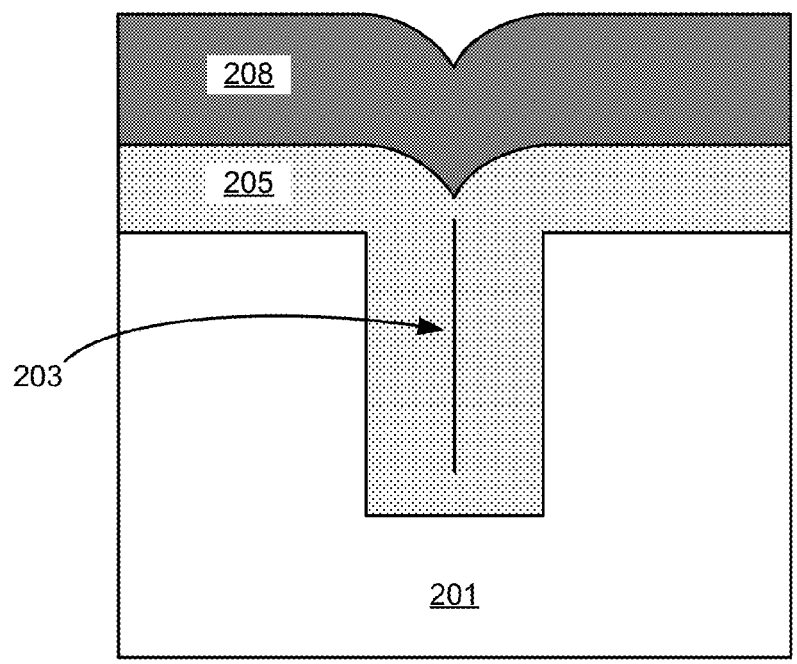
FIGS. 2A and 2B are schematic drawings of a substrate undergoing operations of disclosed embodiments.
Figure 2B:
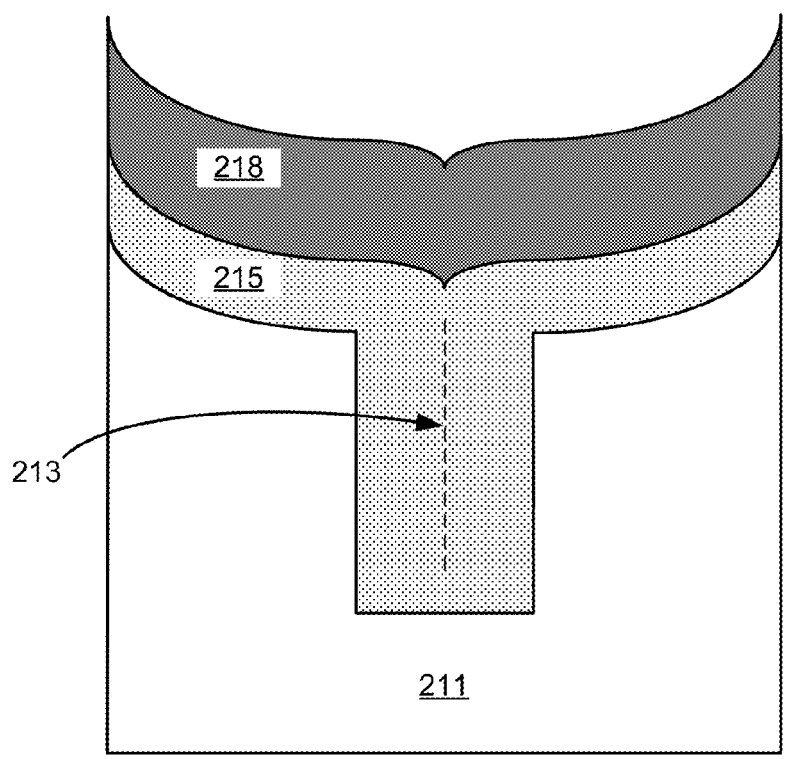

FIGS. 2A and 2B provide examples of a substrate upon which disclosed embodiments are performed. In FIG. 2A, a substrate 201 including a feature is provided Like FIG. 1, an oxide 205 is deposited conformally by ALD, thereby forming a seam 203 in the middle of the feature. In various embodiments, the oxide 205 may be deposited by other methods, such as flowable techniques, thermal CVD, and plasma enhanced CVD (PECVD). In the example of FIG. 2A, the oxide 205 is the material to be densified.

A capping layer 208 is deposited over the substrate and over the oxide 205. The capping layer 208 may be deposited conformally or nonconformally. The capping layer 208 may be a removable capping layer. For example, the capping layer 208 may be removed by stripping or etch techniques after performing disclosed embodiments. The capping layer 208 may be deposited by any suitable technique, including PECVD, thermal ALD, PEALD, CVD, PVD or spin-on methods. The capping layer 208 may be deposited to a thickness between about 500 Å and about 2000 Å. The deposition process conditions and precursors may affect the stress of the capping layer. For example, some capping layer precursors may be able to yield higher stress films than others, depending on process conditions. For example, for silicon-containing precursors, the hydrogen to silicon ratio of a precursor may affect the amount of hydrogen incorporated in the film, which in turn may impact the stress of the film. In some embodiments, hydrogen incorporation may be controlled by toggling process conditions, such as temperature and plasma power, or adding a hydrogen-containing reactant to the reaction. Capping layers deposited by ALD, PECVD, low pressure CVD (LPCVD), or CVD, may incorporate hydrogen, which contributes to the stress behavior of the film. A film deposited by PVD may not incorporate hydrogen. The removal of hydrogen using various methods described herein may increase the stress of the film.

Any material that can be made tensile or compressive and is also removable without removing the material to be densified may be used. In some embodiments, the capping layer includes silicon nitrides, metals, metal nitrides, carbon-containing dielectrics, other carbonitrides, silicon, or combinations thereof. Silicon nitrides include SiN, SiON, SiCN, SiCON, and $Si_3N_4$. Additional examples of capping layers also include silicon carbide (SiC), oxygen-doped silicon carbide (SiCO), nitrogen-doped silicon carbide (SiCN), silicon boron nitride (SiBN), and silicon boron carbide (SiBC). For example, the capping layer may be a silicon layer deposited by CVD, or a silicon layer deposited by PECVD. Example capping layers are further described below with respect to FIG. 3A.

In various embodiments, the capping layer 208 may be deposited as a tensile film. For example, in some embodiments, a tensile film may be deposited by PECVD operating under conditions of low ion bombardment. Ion bombardment depends on deposition rate and ion energy flux. At a higher deposition rate, a higher ion energy flux may be used to maintain the stress of a film such that it is tensile. In some silicon nitride deposition processes, a tensile film may be deposited with high frequency radio frequency plasma (e.g., at 13.56 MHz). In one example for a four-station tool at a chamber pressure of about 9 Torr, the deposition rate when a high frequency radio frequency power is about 600 W may be about 1000 Å/minute. Other conditions may be suitable to deposit a tensile film. In some embodiments, conditions and parameters of the deposition process for depositing the capping layer 208 may tune the stress of a film. For example, in some embodiments where the capping layer 208 includes silicon nitride, the capping layer may be deposited by reacting a silicon-containing reactant with a nitrogen-containing reactant. The nitrogen-containing reactant(s) may be chosen to tune the stress of the deposited silicon nitride capping layer. The reactants may also affect the wet etch rate of the capping layer, which affects the removability of the capping layer.

In some embodiments, a capping layer 208 may be deposited by exposing a substrate to a deposition reactant mixture including two or more reactants and applying both HF and LF power to the chamber to generate a deposition plasma. For example, deposition of a SiN capping layer may involve flowing a gaseous deposition reactant mixture containing silicon atoms and nitrogen atoms into a vacuum chamber and applying both HF and LF power to the chamber to generate a deposition plasma. In some embodiments, an inert gas may also be flowed.

In some embodiments, plasma discharge may be sustained by energy applied to a dual-frequency reaction chamber through both a HF generator, which supplies HFRF, and a LF generator, which supplies LFRF power to the plasma. Usually, HFRF power may be applied to reaction chamber at a showerhead of the chamber. HFRF plasma energy may be about 13.56 MHz, although disclosed embodiments are not limited to any exact frequency value. Generally, the HFRF has a frequency in a range of about from about 1 MHz to about 100 MHz, or about 2 MHz to about 30 MHz. HFRF power may be generally applied at a level of about 0.02 Watts per $cm^2$ to 0.44 Watts per $cm^2$ of substrate surface. LF generator supplies low-frequency power to plasma between a showerhead and a substrate. The LFRF power is generally applied at a substrate holder as described below with respect to FIG. 4. Generally, the LFRF has a frequency in a range of about from about 100 kHz to about 1 MHz, or about 250 kHz. LFRF power may be generally applied at a level of about 0.03 Watts per $cm^2$ to about 0.64 Watts per $cm^2$ of substrate surface. Further description of example PECVD processes for depositing capping layers are described below with respect to FIG. 3A.

In some embodiments, the capping layer 208 may be deposited and then made tensile, as described below. For example, FIG. 2B shows the substrate after annealing the substrate including these layers. Annealing in this example made capping layer 218 tensile. For example, a silicon nitride capping layer 208 shown in FIG. 2A may have compressive stress as deposited, but may be made tensile as shown in FIG. 2B after annealing.

Figure 2C:
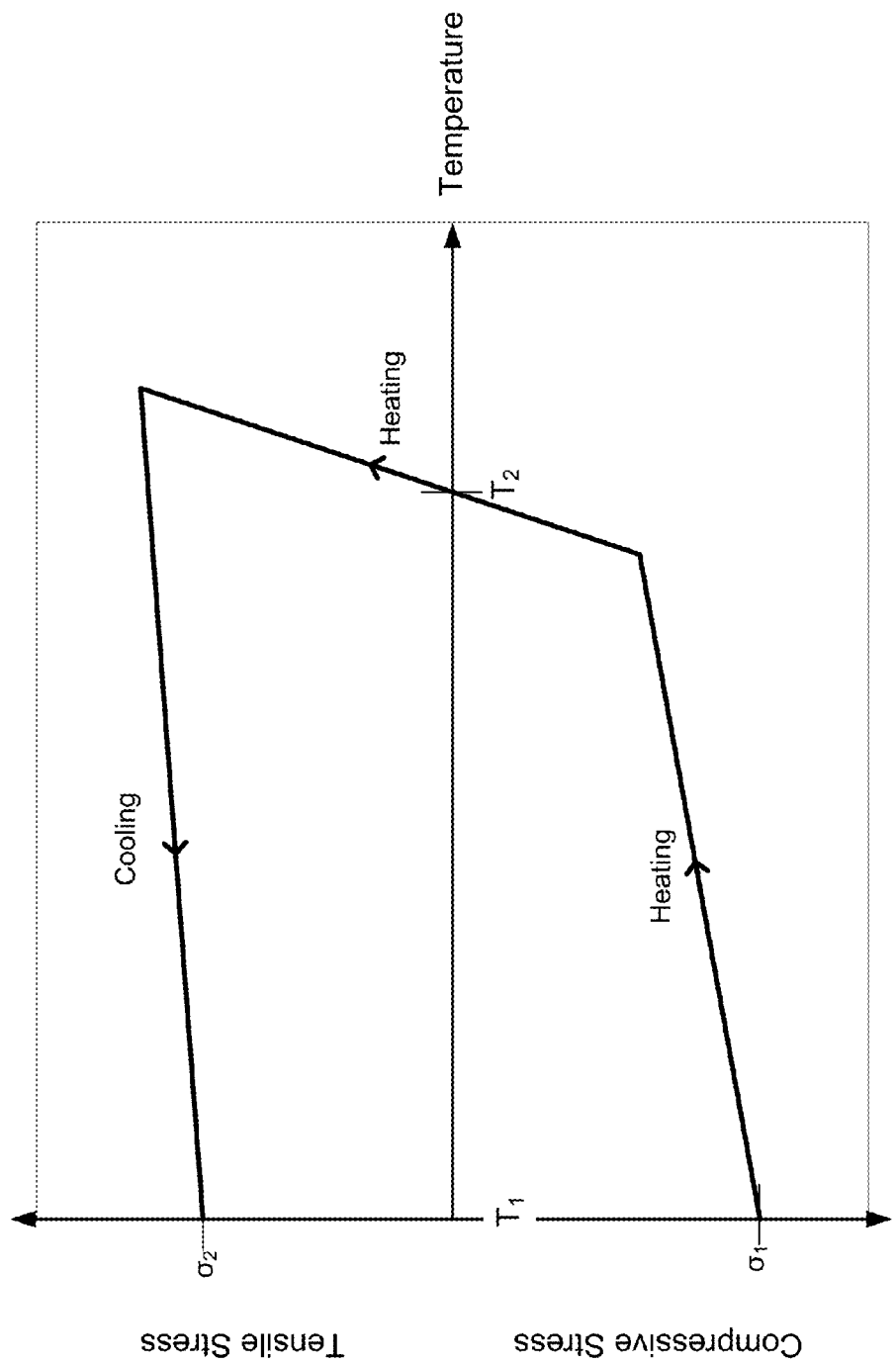
FIG. 2C is an example graph comparing stress and temperature.

FIG. 2C shows an example graph of stress vs. temperature. As indicated in the graph and described above, a silicon nitride layer as deposited may have a compressive stress of $\sigma_1$ at a lower temperature $T_1$. As silicon nitride is heated from the lower temperature $T_2$ to a higher temperature (e.g., heated by thermal anneal), the stress becomes tensile at $T_2$. Upon cooling, the silicon nitride layer then has a tensile stress of $\sigma_2$. Note that the graph provided in FIG. 2C is a simplistic example of stress changing as temperature increases and decreases, and capping layers of different materials may have different curves.

As shown in FIG. 2B, the substrate 211 is bowed due to the stress, and the capping layer 218 is also bowed. Tensile stress from the capping layer 218 induces compressive stress on the oxide 215. Due to the compressive stress on the oxide 215, the seam 213 is repaired and cross-linking across the seam 213 increased. As a result, the oxide 215 is densified. FIGS. 2A and 2B provide one example of disclosed embodiments.

Figure 3A:
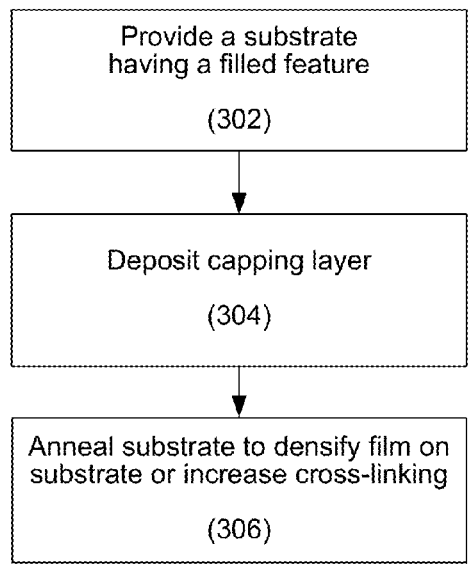
FIGS. 3A-3C are process flow diagrams showing operations of methods performed in accordance with disclosed embodiments.
Figure 3B:
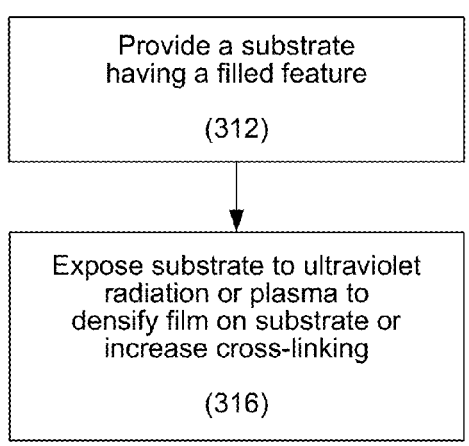
Figure 3C:
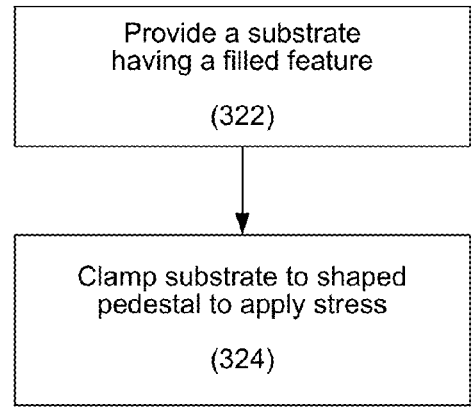

FIGS. 3A, 3B, and 3C are process flow diagrams depicting operations performed in accordance with disclosed embodiments. In FIG. 3A, a substrate is provided in operation 302. The substrate may be any suitable substrate. The substrate may be a silicon wafer, e.g., a 200-mm wafer, a 300-mm wafer, or a 450-mm wafer. In various embodiments, the substrate may have "features" such as via or contact holes, which may be characterized by one or more of narrow and/or re-entrant openings, constrictions within the feature, and high aspect ratios. The substrate may include trenches as described herein. A feature via or trench may be a filled feature. A feature may have a re-entrant profile that narrows from the bottom, closed end, or interior of the feature to the feature opening. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the substrate may include one or more layers of material, such as dielectric, conducting, or semi-conducting material deposited thereon. The substrate also includes a film or material to be densified or modified using disclosed embodiments. The material to be densified may be deposited over a feature on the substrate, such that the material may fill the feature. The material to be densified may be an oxide, nitride, or carbide. In various embodiments, the material to be densified is deposited by ALD or flowable techniques.

For example, for an ALD-deposited oxide, the substrate may have been previously exposed to alternating pulses of a silicon-containing precursor and an oxidant in various cycles to fill a feature with silicon oxide. In some embodiments, the material to be densified is an oxide deposited in layers such that the deposited material is a planar oxide layer or a flowable material.

In operation 304, a capping layer is deposited on the substrate. The capping layer may be deposited on the front side, backside, or both of the substrate. The capping layer may be tensile or compressive. In many embodiments, a tensile film is not deposited on the backside.

A tensile film may be deposited on the front side of the substrate over the material to be densified. In some embodiments, the capping layer is not a tensile film as deposited, but is later made tensile, such as by annealing, as described below.

The capping layer may be deposited by any suitable technique, including PECVD, ALD, PEALD, CVD, PVD, or spin-on methods. In various embodiments, the capping layer includes silicon nitrides, metals, metal nitrides, carbon-containing dielectrics, silicon, other carbonitrides, or combinations thereof. Silicon nitrides include SiN, SiON, SiCN, SiCON, and $Si_3N_4$. Additional examples of capping layers also include silicon carbide (SiC), oxygen-doped silicon carbide (SiCO), nitrogen-doped silicon carbide (SiCN), silicon boron nitride (SiBN), and silicon boron carbide (SiBC). Capping layers deposited by PECVD, ALD, PEALD, and CVD may incorporate some hydrogen atoms in the film. Capping layers deposited by PVD will have little to no hydrogen incorporation. The presence of hydrogen affects the stress of the capping layer.

In various embodiments, the capping layer is a silicon nitride layer. As an example, silicon nitride layer may be deposited by PECVD techniques using any suitable precursors and parameters. For example, in some embodiments, the silicon nitride layer is deposited using a silicon-containing precursor such as silane and a nitrogen plasma at a temperature less than about 450° C. In some embodiments, silicon nitride is deposited at a temperature greater than about 450° C. to deposit a tensile film or to reduce hydrogen content in the silicon nitride film.

Table 1 shows example conditions for depositing a silicon nitride capping layer is deposited by PECVD:

TABLE 1

Example Conditions for Silicon Nitride Deposition by PECVD

| Parameter | Range |
| --- | --- |
| $SiH_4$ (sccm) | 100-200 |
| $NH_3$ (sccm) | 1000-4000 |
| $N_2$ (sccm) | 5000-10000 |
| HFRF (W) | 500-1200 |
| Pressure (Torr) | 6-8 |
| Temperature (° C.) | $250 \leq X \leq 450$ |

Many different reactants may be used to deposit the capping layer. Where the film deposited includes silicon, the silicon compound can be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro- sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$-$(N(CH_3)_2)_2$, $SiHCl$-$(N(CH_3)_2)_2$, $(Si(CH_3)_2NH)_3$, bisdiethylaminosilane (BDEAS), diisopropylaminosilane (DIPAS), tridimethylaminotitanium (TDMAT), and the like. A further example of an aminosilane is trisilylamine ($N(SiH_3)_3$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Metals and compounds including metals may be deposited by PVD. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, and bis(n-propylcyclopentadienyl)magnesium.

In some embodiments, the capping layer contains nitrogen, and a nitrogen-containing reactant is used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary, or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

The thickness of the capping layer depends on the feature size and type. A thicker film as-deposited may have greater tensile stress, but is more likely to crack in an anneal process as described below with respect to operation 305. Accordingly, a thinner capping layer may be deposited instead to prevent cracking of the substrate when the film is annealed. In some embodiments, the capping layer is deposited to a thickness greater than about 1000 Å, such as between about 3000 Å and about 5000 Å, or between about 1000 Å and about 2000 Å. In some applications, capping layers thinner than 1000 Å may be appropriate. However, as discussed below with reference to FIG. 7C, densification and seam repair may be easier using thicker films.

In some embodiments, a capping layer deposited in operation 304 is compressive. A compressive film is deposited on the backside of the substrate. In some embodiments a compressive film is deposited on the backside of the substrate while a tensile film is deposited on the front side. In various embodiments, the compressive film is removable.

The compressive film may be compressive as deposited, or may be made compressive. In various embodiments a compressive film is transparent to ultraviolet radiation and susceptible to stress change when exposed to ultraviolet radiation. Example compressive films include nitride films, carbon-containing films, carbonitride films, metals, metal nitrides, carbon, and $Si_xB_yN_zC_pH_q$ compounds.

Deposition of a compressive film on the backside of a substrate may be performed using a variety of methods. For example, in some embodiments, the substrate is housed in a furnace and after the compressive film is deposited on both sides of the substrate, the film on the front side of the substrate is etched to remove the compressive film from the front side and leave only the compressive film on the backside of the substrate. In another example, the substrate may be flipped such that the backside of the wafer is exposed, and a compressive film is deposited only on the backside of the substrate in a chamber including a showerhead or other process gas delivery method. Although it may be possible to deposit the compressive film when the substrate is flipped, it will be understood that additional operations may be used to prevent damage to the front side of the substrate when performing disclosed embodiments. Various backside deposition tools may be used to deposit such a film.

In operation 306, the substrate is annealed. A capping layer that includes incorporated hydrogen atoms will contract when annealed such that the hydrogen atoms are removed from the capping layer during the annealing process. For example, a capping layer deposited by PECVD may include incorporated hydrogen atoms, which are removed during operation 306.

Annealing may be accomplished by a number of different techniques, including thermal, plasma and electromagnetic radiation based processes. The anneal may be performed using a thermal anneal, such as by heating the substrate to a temperature of at least 450° C. Annealing improves cross-linking in some deposited films to densify the material, and also increases the compressive stress on deposited films, such as films to be densified. An annealing operation can be carried out in situ in the deposition chamber, in an integrated module or tool with no vacuum break, or in a separate chamber with vacuum break.

In some embodiments, an ultraviolet anneal is performed. For example, if thermal budget is a concern, an ultraviolet anneal may be performed. In an ultraviolet anneal, the substrate may be heated to a temperature less than about 450° C. and exposed to ultraviolet radiation to increase cross-linking, densify the film underlying the capping layer, and/or increase the compressive stress of the material under a capping layer. In various embodiments, ultraviolet radiation is used when the capping layer deposited is transparent. The capping layer may, for example, be a silicon nitride layer, with little or no silicon-hydrogen bonds to ensure transparency of the film. However, in some embodiments, since the capping layer may be deposited to a thickness of at least about 1000 Å, a capping layer deposited on the material to be densified may not be sufficiently transparent to perform an ultraviolet anneal. Accordingly, in some embodiments, a capping layer may be deposited on the backside of a wafer as described above. Note that where a capping layer is deposited on the backside, the capping layer is a compressive film, instead of a tensile film.

In some embodiments, an ultraviolet cure may be performed to anneal a material to be densified without depositing a capping film. In some embodiments, this may be performed in combination with clamping the substrate including the material to be densified to a curved pedestal, as described further below. Such method may be performed at temperatures up to about 1000° C. In some embodiments, there may be advantages for advanced devices if an anneal can be performed at less than about 600° C. or less than about 450° C., depending on the device type. If no capping layer is deposited, reactive gases may be used to increase cross-linking and densification. For example, to densify a silicon oxide material, reactive gases include hydrogen-containing gases and/or oxygen-containing gases and/or gases containing both hydrogen and oxygen, such as $H_2O$ or $H_2O_2$.

In some embodiments, a material to be densified may be exposed to a plasma treatment without deposition of a capping film. For example, a plasma may include any of He, Ar, H, O, N, and mixtures and compounds thereof.

Returning to FIG. 3A, performing operation 305 increases the stress of the tensile film to at least about 1 GPa, thereby providing compressive stress to the film under the capping layer. For example, for densifying a silicon oxide film, annealing the substrate after depositing a silicon nitride layer densifies the silicon oxide film.

Note that in various embodiments, the capping layer may be removed after the film or material underlying the capping layer is densified or cross-linked or the compressive stress of the capping layer is sufficient for subsequent operations, depending on the application of disclosed embodiments. For example, a silicon nitride capping layer may be selectively removed using phosphoric acid or using a dry etch method after a substrate including silicon oxide and the silicon nitride capping layer is annealed.

FIG. 3B provides another example of a method performed in accordance with disclosed embodiments. In operation 312, a substrate including a material to be densified is provided. Any substrate as described above with respect to operation 302 may be used for this operation.

In operation 316, the substrate is exposed to ultraviolet radiation or a plasma treatment to densify the material on the substrate and/or to increase cross-linking of the material to be densified. This operation thereby densifies the material to a suitable stress. The UV radiation may be at any appropriate wavelength. For example, UV radiation around 30-150 nm may be used for crosslinking. In some embodiments, operation 316 may include exposing the substrate to a reactant to form a more tensile or more compressive film as desired. Plasma treatments can be used to react with the material to be densified, for instance by removing hydrogen present in the material to be densified and changing the film stress. Helium, argon, hydrogen, nitrogen, or oxygen-containing plasmas or mixtures thereof may be used to generate the plasma.

Operations in FIG. 3B may be performed at a temperature less than about 450° C. Densification may be performed at a lower temperature when the substrate is exposed to UV, because the UV treatment provides sufficient energy to enable cross-linking of the film to be densified, thereby increasing the density of the film.

FIG. 3C provides another example of a method performed in accordance with disclosed embodiments. In operation 322, a substrate is provided. The substrate may be any of those described above with respect to operations 302 and 312. In operation 324, the substrate is clamped to a shaped pedestal to apply stress. The pedestal includes an electrostatic chuck or other clamping apparatus for clamping the substrate to the pedestal. The shaped pedestal may be bowl-shaped or include a concave region near the center of the pedestal such that when the substrate is clamped to the pedestal, the substrate substantially conforms to the shape of the pedestal, thereby increasing the stress on the substrate to densify one or more films on the substrate.

Disclosed embodiments are suitable for densifying various types of films using external stress control, thereby providing a method of modulating stress of one film on a substrate to densify another film on the substrate. The disclosed embodiments can be used for forming a dielectric film for any purpose. In some embodiment, disclosed embodiments can be used for filling structures, such as gaps, in particular high aspect ratio trenches, on semiconductor substrates, e.g., inter-metal dielectric, pre-metal dielectric, and shallow trench isolation applications.

Apparatus

Disclosed embodiments may be performed in any suitable apparatus or tool. An apparatus or tool may include one or more process stations. For embodiments where an electrostatic chuck is used to clamp a substrate to a shaped pedestal, a process station including a shaped pedestal may be used. In some embodiments, a furnace tool or station may be used such that a film may be deposited on both sides of a substrate and one side may be subsequently etched for some embodiments. For a furnace tool, the film deposited may be compressive or may be made compressive. In some embodiments, a capping layer is deposited over the substrate instead of on both sides of a substrate. Described below are an example process station and tool that may be used in some embodiments.

Figure 4:
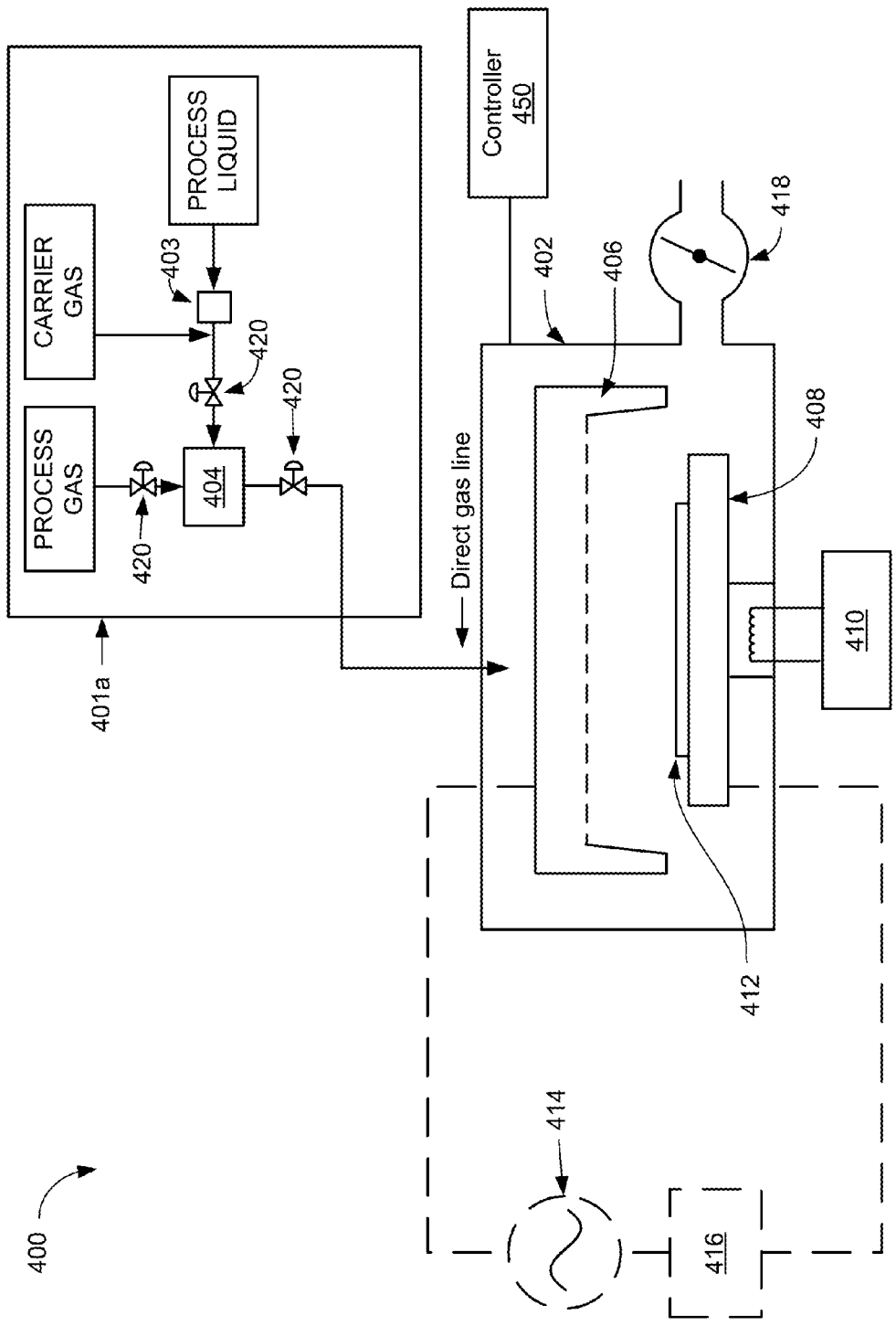
FIG. 4 is a schematic diagram of an example process station for performing disclosed embodiments.
Figure 5:
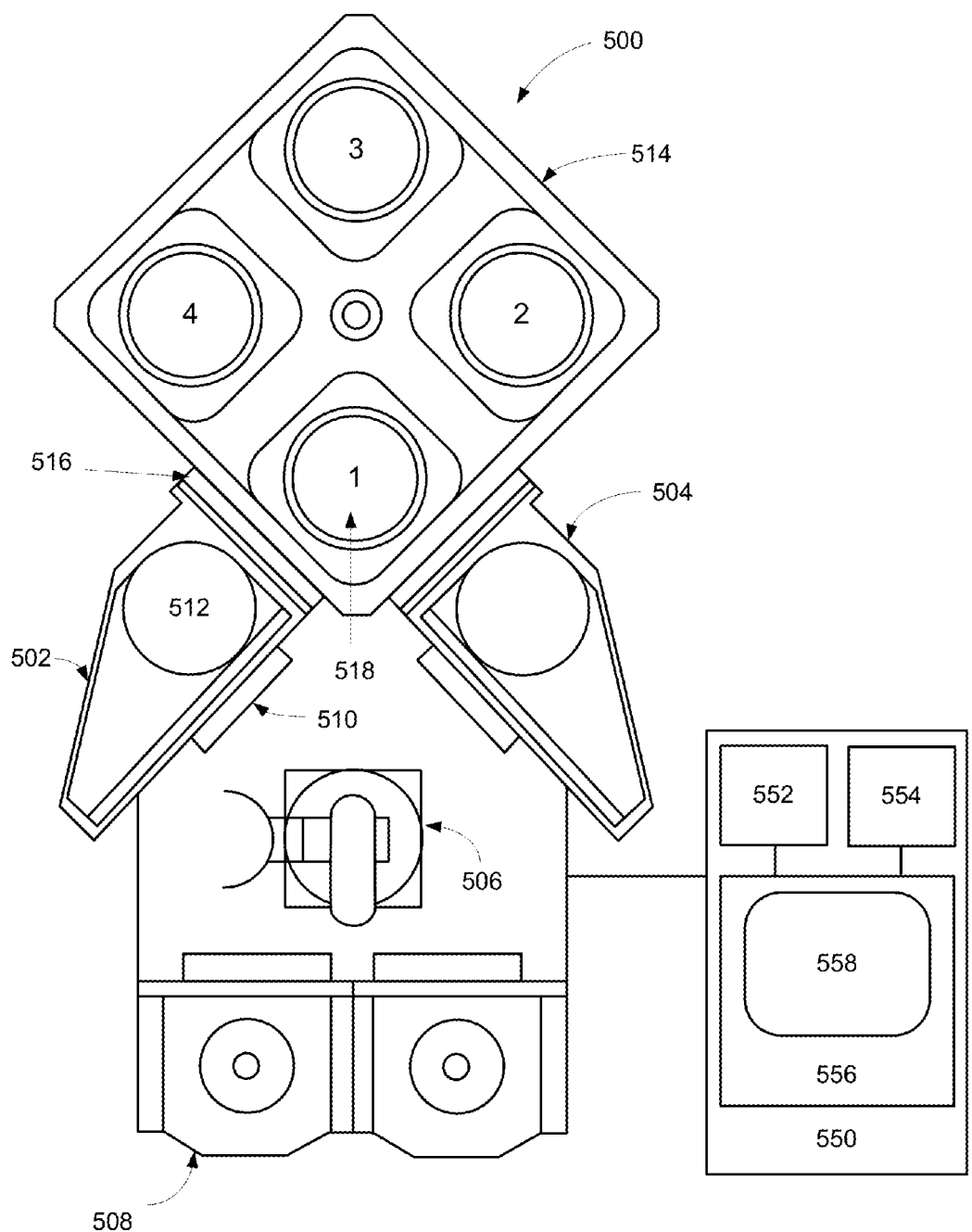
FIG. 5 is a schematic diagram of an example process tool for performing disclosed embodiments.

FIG. 4 depicts a schematic illustration of an embodiment of plasma-enhanced chemical vapor deposition (PECVD) process station 400 having a process chamber body 402 for maintaining a low pressure environment. A plurality of PECVD process stations 400 may be included in a common low pressure process tool environment. For example, FIG. 5 depicts an embodiment of a multi-station processing tool 500. In some embodiments, one or more hardware parameters of PECVD process station 400, including those discussed in detail below, may be adjusted programmatically by one or more computer controllers 450.

PECVD process station 400 fluidly communicates with reactant delivery system 401a for delivering process gases to a distribution showerhead 406. Reactant delivery system 401a includes a mixing vessel 404 for blending and/or conditioning process gases for delivery to showerhead 406. Process gases such as those used to deposit a capping layer on a substrate may be delivered to the process chamber body 402 via showerhead 406 using the reactant delivery system 401a. In some embodiments, reactive species may be delivered using the reactant delivery system 401a. One or more mixing vessel inlet valves 420 may control introduction of process gases to mixing vessel 404. These valves may be controlled depending on whether a gas may be turned on during various operations.

Note that in some embodiments, a liquid reactant may not be used. However in some embodiments, a liquid reactant may be used to deposit a film to be densified or a capping layer or compressive film as described herein. As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant before or after vaporizing a reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) (not shown) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for flowing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes gases toward substrate 412. For example, showerhead 406 may distribute process gases for depositing a capping layer to the substrate 412 in various operations, such as silicon-containing gases and/or nitrogen-containing gases. In the embodiment shown in FIG. 4, the substrate 412 is located beneath showerhead 406 and is shown resting on a pedestal 408. Note that although the pedestal 408 shown in FIG. 4 does not include an electrostatic chuck and includes a flat surface, in some embodiments a shaped pedestal including an electrostatic chuck may be used. As described herein, a shaped pedestal may be bowl-shaped or include a concave region near the center of the pedestal such that when the substrate is clamped to the pedestal, the substrate 412 substantially conforms to the shape of the pedestal, thereby increasing the stress on the substrate 412 to densify one or more films on the substrate. Showerhead 406 may have any suitable shape, and may have any suitable number and arrangement of ports for distributing process gases to substrate 412.

In another scenario, adjusting a height of pedestal 408 may allow a plasma density to be varied during disclosed processes. For example, the plasma may be activated when process gases are flowed to the chamber body 402. At the conclusion of the process, pedestal 408 may be lowered during another substrate transfer phase to allow removal of substrate 412 from pedestal 408.

In some embodiments, showerhead 406 and pedestal 408 electrically communicate with a radio frequency (RF) power supply 414 and matching network 416 for powering a plasma. In some embodiments, the plasma energy may be controlled by controlling one or more of a process station pressure, gas concentrations and partial pressures of gases or gas flow rates, an RF source power, and an RF source frequency. For example, RF power supply 414 and matching network 416 may be operated at any suitable power to form a plasma having a desired composition of radical species. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for a reaction for depositing a film to be densified or a capping layer.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of one or more gases (e.g., a silicon-containing gas and a nitrogen-containing gas), and time delay instructions for the first recipe phase. A second, subsequent recipe phase may include instructions for heating the substrate to a temperature greater than about 450° C. and time delay instructions for the second recipe phase. Alternatively, a third recipe phase may include instructions for turning on an ultraviolet source and heating the substrate to a temperature less than about 450° C. and time delay instructions for the third recipe phase. It will be appreciated that these recipe phases may be further subdivided and/or iterated in any suitable way within the scope of the present disclosure. Controller 450 may also include any of the features described below with respect to controller 550 in FIG. 5.

In some embodiments, pedestal 408 may be temperature controlled via heater 410. Heater 410 may be used to anneal the substrate. For example, in some embodiments, during annealing, the heater 410 may be set to a temperature of at least about 450° C. Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506, at atmospheric pressure, is configured to move wafers from a cassette loaded through a pod 508 into inbound load lock 502 via an atmospheric port 510. A wafer or substrate is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station (station 1) shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and PECVD process mode. For example, a process station may be used to both deposit a material to be densified by ALD and form a capping layer by PECVD. In some embodiments, a process station may be used to deposit a film by ALD while another is used to deposit a capping layer by PECVD and yet another is used to anneal a substrate. In some embodiments, deposition of the film to be densified and the capping layer may be performed in the same station. Deposition and annealing may be performed in the same or in different stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, electrostatic chuck power control program, and a plasma control program.

A substrate positioning program may include program code for process tool components that are used to load the substrate onto pedestal 518 and to control the spacing between the substrate and other parts of process tool 500. A process gas control program may include code for controlling gas composition (e.g., silicon-containing gases, nitrogen-containing gases, etc., as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc. A heater control program may include code for controlling the current to a heating unit that is used to heat the substrate for annealing operations described herein. Alternatively, the heater control program may control delivery of a heat transfer gas (such as helium) to the substrate. A plasma control program may include code for setting RF power levels applied to the process electrodes in one or more process stations in accordance with the embodiments herein. A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above described deposition processes. The program instructions may control a variety of process parameters, such as DC power level, RF bias power level, pressure, temperature, etc. The instructions may control the parameters to operate in-situ deposition of films according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD or PECVD chamber or module, an ALD or PEALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Figure 6:
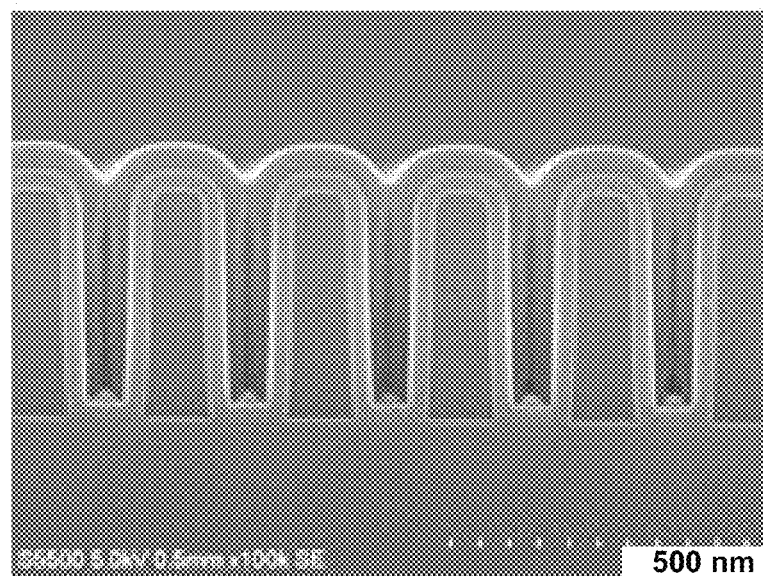
FIGS. 6, 7A, 7B, and 7C are images of substrates processed in experiments performed in accordance with disclosed embodiments.
Figure 7A:
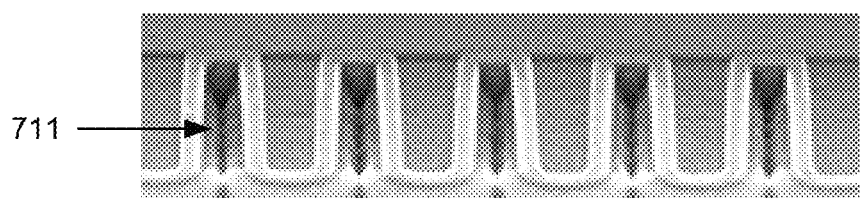

An experiment was conducted on an oxide deposited by atomic layer deposition in features on a substrate. A seam formed in the center of the features where the oxide growth from the sidewalls of the feature. An image of the substrate is shown in FIG. 6. An alternate view of the same substrate tilted and upside down is shown in FIG. 7A. Note the presence of the seam 711 in the features.

Figure 7B:
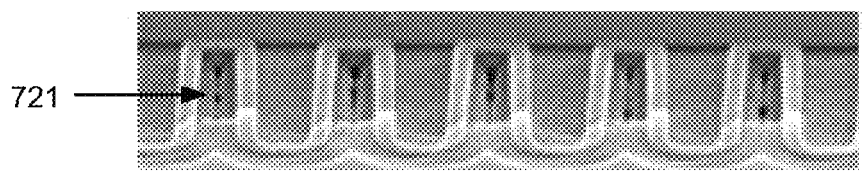

A silicon nitride capping layer was deposited over the substrate to a thickness of 1000 Å and the substrate was annealed at 800° C. to make the silicon nitride film tensile and accordingly densify the underlying oxide. An image of the resulting substrate is shown in FIG. 7B. Note the seam 721 is reduced as compared to FIG. 7A, showing the effect of disclosed embodiments to densify the film.

Experiment 2

Figure 7C:
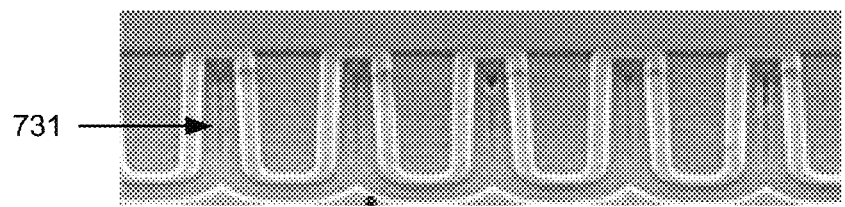

An experiment was conducted on an oxide deposited in features on a substrate by atomic layer deposition. A seam formed in the center of the features where the oxide growth from the sidewalls of the feature. A silicon nitride cap layer was deposited over the substrate to a thickness of 2000 Å and the substrate was annealed at 800° C. to make the silicon nitride film tensile and accordingly densify the underlying oxide. An image of the resulting substrate is shown in FIG. 7C. Note the seam 731 is even more reduced as compared to FIG. 7B. As thickness of the tensile material (here, silicon nitride) increased, the seam was further reduced and repaired.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of densifying material in a recessed feature on a semiconductor substrate, the method comprising:
   receiving the semiconductor substrate comprising the recessed feature and a seam, the recessed feature filled with the material to be densified;
   forming a removable film over the material to be densified in the recessed feature on the substrate, the substrate having a diameter selected from the group consisting of 200 mm, 300 mm, and 450 mm; and
   annealing the substrate to transfer stress from the removable film to the material and densify the material,
   wherein the removable film is selected from the group consisting of metal-containing nitrides, metal-containing oxides, silicon-containing nitrides, and silicon-containing carbides, and
   wherein annealing the substrate comprises crosslinking the seam in the recessed feature.

2. The method of claim 1, wherein the removable film is tensile.

3. The method of claim 2, wherein annealing the substrate induces tensile stress in the removable film.

4. The method of claim 2, wherein the annealing the substrate comprises heating the substrate at a temperature greater than at least about 450° C.

5. The method of claim 2, wherein the tensile stress of the removable film is at least about 1 GPa.

6. The method of claim 1, wherein the material to be densified is an oxide.

7. The method of claim 1, further comprising after annealing the substrate, treating the substrate with ultraviolet radiation or plasma.

8. The method of claim 1, wherein the material to be densified is a nitride or carbide.

9. The method of claim 1, wherein the removable film is deposited to a thickness of at least about 1000 Å.

10. The method of claim 1, further comprising removing the removable film.

11. The method of claim 1, wherein the removable film is compressive.

12. The method of claim 11, wherein annealing the substrate induces compressive stress in the removable film.

13. The method of claim 11, wherein the removable film is deposited on the substrate housed in a furnace.

14. The method of claim 11, further comprising forming a removable tensile film over the material to be densified prior to annealing the substrate.

15. The method of claim 1, wherein annealing the substrate causes the semiconductor substrate and the removable film to be bowed.

16. A method of densifying material in a recessed feature on a semiconductor substrate, the method comprising:
   receiving the semiconductor substrate comprising the recessed feature and a seam, the recessed feature filled with the material to be densified;
   forming a removable compressive film on the backside of the semiconductor substrate, the semiconductor substrate having a diameter selected from the group consisting of 200 mm, 300 mm, and 450 mm; and
   annealing the substrate to transfer stress from the removable compressive film to the material and densify the material,
   wherein annealing the substrate comprises crosslinking a seam in the feature.

* * * * *